(12) United States Patent
Sprinkle et al.

(10) Patent No.: US 8,447,918 B2
(45) Date of Patent: May 21, 2013

(54) GARBAGE COLLECTION FOR FAILURE PREDICTION AND REPARTITIONING

(75) Inventors: Robert S. Sprinkle, San Jose, CA (US); Albert T. Borchers, Santa Cruz, CA (US); Andrew T. Swing, Los Gatos, CA (US)

(73) Assignee: Google Inc., Mountain View, CA (US)

( * ) Notice: Subject to any disclaimer, the term of this patent is extended or adjusted under 35 U.S.C. 154(b) by 464 days.

(21) Appl. No.: 12/755,964

(22) Filed: Apr. 7, 2010

(65) Prior Publication Data

US 2010/0262766 A1 Oct. 14, 2010

Related U.S. Application Data

(60) Provisional application No. 61/167,709, filed on Apr. 8, 2009, provisional application No. 61/187,835, filed on Jun. 17, 2009, provisional application No. 61/304,469, filed on Feb. 14, 2010, provisional application No. 61/304,468, filed on Feb. 14, 2010, provisional application No. 61/304,475, filed on Feb. 14, 2010.

(51) Int. Cl.
*G06F 12/00* (2006.01)
*G06F 11/30* (2006.01)

(52) U.S. Cl.
USPC .......... 711/103; 711/172; 711/E12.001; 711/E12.008; 711/E12.009; 714/47.3; 714/E11.179

(58) Field of Classification Search
None
See application file for complete search history.

(56) References Cited

U.S. PATENT DOCUMENTS

| | | | |
|---|---|---|---|
| 4,449,182 A | 5/1984 | Rubinson et al. |
| 4,777,595 A | 10/1988 | Strecker et al. |
| 5,619,687 A | 4/1997 | Langan et al. |
| 5,708,814 A | 1/1998 | Short et al. |
| 5,802,345 A | 9/1998 | Matsunami et al. |
| 5,844,776 A | 12/1998 | Yamaguchi et al. |
| 5,941,998 A | 8/1999 | Tillson |
| 6,003,112 A | 12/1999 | Tetrick |
| 6,009,478 A | 12/1999 | Panner et al. |
| 6,167,338 A | 12/2000 | De Wille et al. |
| 6,343,660 B1 | 2/2002 | Mutsaers |
| 6,640,290 B1 | 10/2003 | Forin et al. |

(Continued)

FOREIGN PATENT DOCUMENTS

| | | |
|---|---|---|
| EP | 1736885 A2 | 12/2006 |
| JP | 2004-071033 | 3/2004 |

(Continued)

OTHER PUBLICATIONS

International Search Report and Written Opinion received for PCT Application No. PCT/US2010/029677, mailed on Jul. 5, 2010, 13 pages.

(Continued)

*Primary Examiner* — Kevin Verbrugge
(74) *Attorney, Agent, or Firm* — Brake Hughes Bellermann LLP

(57) ABSTRACT

A method of formatting a data storage device that includes a plurality of flash memory chips includes monitoring a failure rate of memory blocks of one or more flash memory chips of a storage device that has a first usable size for user space applications, estimating a future usable size of the data storage device based on the monitored failure rate, and defining, via a host coupled to the data storage device, a second usable size of the data storage device for user space applications based on the monitored failure rate.

16 Claims, 6 Drawing Sheets

U.S. PATENT DOCUMENTS

| | | |
|---|---|---|
| 6,678,463 B1 | 1/2004 | Pierre et al. |
| 6,697,284 B2 | 2/2004 | Marotta |
| 6,757,797 B1 | 6/2004 | Kaiya et al. |
| 6,781,914 B2 | 8/2004 | Ha |
| 6,854,022 B1 | 2/2005 | Thelin |
| 6,868,007 B2 | 3/2005 | Hasegawa et al. |
| 6,931,498 B2 | 8/2005 | Talreja et al. |
| 6,938,188 B1 | 8/2005 | Kelleher |
| 6,982,919 B2 | 1/2006 | Kumahara et al. |
| 7,000,245 B1 | 2/2006 | Pierre et al. |
| 7,012,632 B2 | 3/2006 | Freeman et al. |
| 7,028,137 B2 | 4/2006 | Nashimoto et al. |
| 7,080,245 B2 | 7/2006 | Ballard et al. |
| 7,080,377 B2 | 7/2006 | Peled et al. |
| 7,088,387 B1 | 8/2006 | Freeman et al. |
| 7,114,051 B2 | 9/2006 | Guu et al. |
| 7,127,549 B2 | 10/2006 | Sinclair |
| 7,127,551 B2 | 10/2006 | Beck |
| 7,158,167 B1 | 1/2007 | Yerazunis et al. |
| 7,159,104 B2 | 1/2007 | Dewey |
| 7,161,834 B2 | 1/2007 | Kumahara et al. |
| 7,225,289 B2 | 5/2007 | Tee et al. |
| 7,296,213 B2 | 11/2007 | Vainsencher et al. |
| 7,310,699 B2 | 12/2007 | Sinclair |
| 7,325,104 B2 | 1/2008 | Satori et al. |
| 7,328,304 B2 | 2/2008 | Royer, Jr. et al. |
| 7,356,637 B2 | 4/2008 | Tee et al. |
| 7,370,230 B1 | 5/2008 | Flake |
| 7,392,367 B2 | 6/2008 | Clark et al. |
| 7,406,572 B1 | 7/2008 | Nguyen |
| 7,546,393 B2 | 6/2009 | Day et al. |
| 7,562,366 B2 | 7/2009 | Pope et al. |
| 7,631,084 B2 | 12/2009 | Thomas et al. |
| 7,660,306 B1 | 2/2010 | Eiriksson et al. |
| 7,668,177 B1 | 2/2010 | Trapp et al. |
| 7,730,257 B2 | 6/2010 | Franklin |
| 7,836,378 B2 | 11/2010 | Shaeffer et al. |
| 7,865,809 B1 | 1/2011 | Lee et al. |
| 7,904,639 B2 | 3/2011 | Kim et al. |
| 8,037,234 B2 | 10/2011 | Yu et al. |
| 8,051,253 B2 | 11/2011 | Okin et al. |
| 8,086,936 B2 | 12/2011 | Gower et al. |
| 8,205,037 B2 | 6/2012 | Swing et al. |
| 8,380,909 B2 | 2/2013 | Borchers et al. |
| 2001/0023472 A1 | 9/2001 | Kubushiro et al. |
| 2002/0005895 A1 | 1/2002 | Freeman et al. |
| 2002/0053004 A1 | 5/2002 | Pong |
| 2002/0078285 A1 | 6/2002 | Hofstee et al. |
| 2002/0144066 A1 | 10/2002 | Talreja et al. |
| 2002/0178307 A1 | 11/2002 | Pua et al. |
| 2003/0039140 A1 | 2/2003 | Ha |
| 2003/0058689 A1 | 3/2003 | Marotta |
| 2003/0101327 A1 | 5/2003 | Beck |
| 2003/0117846 A1 | 6/2003 | Hasegawa et al. |
| 2003/0208771 A1 | 11/2003 | Hensgen et al. |
| 2003/0221092 A1 | 11/2003 | Ballard et al. |
| 2003/0225960 A1 | 12/2003 | Guu et al. |
| 2004/0049649 A1 | 3/2004 | Durrant |
| 2004/0078729 A1 | 4/2004 | Peter |
| 2004/0236933 A1 | 11/2004 | Dewey |
| 2005/0041509 A1 | 2/2005 | Kumahara et al. |
| 2005/0160218 A1 | 7/2005 | See et al. |
| 2005/0172067 A1 | 8/2005 | Sinclair |
| 2005/0172087 A1 | 8/2005 | Klingman |
| 2005/0177698 A1 | 8/2005 | Ku et al. |
| 2005/0193164 A1 | 9/2005 | Royer et al. |
| 2006/0053308 A1 | 3/2006 | Zimmerman |
| 2006/0062052 A1 | 3/2006 | Kumahara et al. |
| 2006/0123284 A1 | 6/2006 | Hwang et al. |
| 2006/0184758 A1 | 8/2006 | Satori et al. |
| 2006/0206653 A1 | 9/2006 | Tee et al. |
| 2007/0008801 A1 | 1/2007 | Chiang et al. |
| 2007/0028040 A1 | 2/2007 | Sinclair |
| 2007/0101238 A1 | 5/2007 | Resnick et al. |
| 2007/0113150 A1 | 5/2007 | Resnick et al. |
| 2007/0198796 A1 | 8/2007 | Warren, Jr. |
| 2007/0208900 A1 | 9/2007 | Tee et al. |
| 2007/0255890 A1 | 11/2007 | Urata et al. |
| 2007/0255981 A1 | 11/2007 | Eto et al. |
| 2007/0288686 A1 | 12/2007 | Arcedera et al. |
| 2007/0288692 A1 | 12/2007 | Bruce et al. |
| 2008/0010431 A1 | 1/2008 | Chang et al. |
| 2008/0022186 A1 | 1/2008 | Co et al. |
| 2008/0040531 A1 | 2/2008 | Anderson |
| 2008/0052448 A1 | 2/2008 | Minz et al. |
| 2008/0052449 A1 | 2/2008 | Kim et al. |
| 2008/0052451 A1 | 2/2008 | Pua et al. |
| 2008/0059747 A1 | 3/2008 | Burckart et al. |
| 2008/0065815 A1 | 3/2008 | Nasu et al. |
| 2008/0077727 A1 | 3/2008 | Baca et al. |
| 2008/0126658 A1 | 5/2008 | Wang |
| 2008/0147931 A1 | 6/2008 | McDaniel et al. |
| 2008/0155160 A1 | 6/2008 | McDaniel |
| 2008/0163030 A1 | 7/2008 | Lee |
| 2008/0178025 A1 | 7/2008 | Hand et al. |
| 2008/0209157 A1 | 8/2008 | Weng |
| 2008/0222491 A1 | 9/2008 | Lee et al. |
| 2008/0235467 A1 | 9/2008 | Tagawa |
| 2008/0288814 A1 | 11/2008 | Kitahara |
| 2008/0294814 A1 | 11/2008 | Gorobets |
| 2008/0301349 A1 | 12/2008 | Bacha |
| 2008/0301381 A1 | 12/2008 | Lee et al. |
| 2008/0320214 A1 | 12/2008 | Ma et al. |
| 2009/0006720 A1 | 1/2009 | Traister |
| 2009/0037652 A1 | 2/2009 | Yu et al. |
| 2009/0044078 A1 | 2/2009 | Vogan et al. |
| 2009/0055590 A1 | 2/2009 | Takahashi |
| 2009/0063895 A1 | 3/2009 | Smith |
| 2009/0063922 A1 | 3/2009 | Gower et al. |
| 2009/0063934 A1 | 3/2009 | Jo |
| 2009/0119443 A1 | 5/2009 | Tremaine |
| 2009/0125785 A1 | 5/2009 | Gorobets et al. |
| 2009/0125790 A1 | 5/2009 | Iyer et al. |
| 2009/0164698 A1 | 6/2009 | Ji et al. |
| 2009/0240873 A1 | 9/2009 | Yu et al. |
| 2009/0265513 A1 | 10/2009 | Ryu |
| 2010/0049914 A1 | 2/2010 | Goodwin |
| 2010/0153660 A1 | 6/2010 | Lasser et al. |
| 2010/0211737 A1 | 8/2010 | Flynn et al. |
| 2010/0262738 A1 | 10/2010 | Swing et al. |
| 2010/0262740 A1 | 10/2010 | Borchers et al. |
| 2010/0262757 A1 | 10/2010 | Sprinkle et al. |
| 2010/0262758 A1 | 10/2010 | Swing et al. |
| 2010/0262759 A1 | 10/2010 | Borchers et al. |
| 2010/0262760 A1 | 10/2010 | Swing et al. |
| 2010/0262761 A1 | 10/2010 | Borchers et al. |
| 2010/0262762 A1 | 10/2010 | Borchers et al. |
| 2010/0262767 A1 | 10/2010 | Borchers et al. |
| 2010/0262773 A1 | 10/2010 | Borchers et al. |
| 2010/0262894 A1 | 10/2010 | Swing et al. |
| 2010/0262979 A1 | 10/2010 | Borchers et al. |
| 2010/0269015 A1 | 10/2010 | Borchers et al. |
| 2010/0287217 A1 | 11/2010 | Borchers et al. |
| 2011/0191554 A1 | 8/2011 | Sakai |
| 2011/0213921 A1 | 9/2011 | Yu et al. |
| 2011/0238885 A1 | 9/2011 | Kitahara et al. |
| 2012/0030416 A1 | 2/2012 | Borchers et al. |
| 2012/0030507 A1 | 2/2012 | Borchers et al. |
| 2012/0030542 A1 | 2/2012 | Borchers et al. |

FOREIGN PATENT DOCUMENTS

| | | |
|---|---|---|
| WO | 01/33852 A1 | 5/2001 |
| WO | 01/90900 A1 | 11/2001 |
| WO | 02/03388 A2 | 1/2002 |
| WO | 02/11424 A2 | 2/2002 |
| WO | 02/058383 A1 | 7/2002 |
| WO | 2005/081097 A2 | 9/2005 |
| WO | 2005/093588 A2 | 10/2005 |
| WO | 2005/081097 A3 | 11/2005 |
| WO | 2005/093588 A3 | 12/2006 |
| WO | 2007/072313 A2 | 6/2007 |
| WO | 2007/072317 A2 | 6/2007 |
| WO | 2007/072317 A3 | 6/2007 |
| WO | 2007/096844 A2 | 8/2007 |
| WO | 2007/096884 A3 | 8/2007 |
| WO | 2007/146756 A2 | 12/2007 |
| WO | 2007/146845 A2 | 12/2007 |

| | | |
|---|---|---|
| WO | 2008/022094 A2 | 2/2008 |
| WO | 2008/040028 A2 | 4/2008 |
| WO | 2008/025238 A1 | 6/2008 |
| WO | 2008/147752 A1 | 12/2008 |

OTHER PUBLICATIONS

International Search Report and Written Opinion received for PCT Application No. PCT/US2010/029679, mailed on Jul. 5, 2010, 20 pages.
International Search Report and Written Opinion received for PCT Application No. PCT/US2010/029916, mailed on Jul. 7, 2010, 14 pages.
International Search Report and Written Opinion received for PCT Application No. PCT/US2010/029917, mailed on Jul. 28, 2010, 19 pages.
International Search Report and Written Opinion received for PCT Application No. PCT/US2010/029919, mailed on Jul. 28, 2010, 11 pages.
International Search Report and Written Opinion received for PCT Application No. PCT/US 2010/030389, mailed on Jul. 21, 2010, 11 pages.
U.S. Appl. No. 12/537,733, filed Aug. 7, 2009.
U.S. Appl. No. 12/537,727, filed Aug. 7, 2009.
U.S. Appl. No. 12/537,725, filed Aug. 7, 2009.
U.S. Appl. No. 12/537,722, filed Aug. 7, 2009.
U.S. Appl. No. 12/537,719, filed Aug. 7, 2009.
U.S. Appl. No. 12/756,009, filed Apr. 7, 2010, 35 pages.
U.S. Appl. No. 12/537,709, filed Aug. 7, 2009.
U.S. Appl. No. 12/537,748, filed Aug. 7, 2009.
U.S. Appl. No. 12/756,007, filed Apr. 7. 2010, 54 pages.
U.S. Appl. No. 12/537,738, filed Aug. 7, 2009.
U.S. Appl. No. 12/756,477, filed Apr. 8, 2010, 51 pages.
U.S. Appl. No. 12/755,968, filed Apr. 7, 2010, 41 pages.
Notice of Allowance for U.S. Appl. No. 12/537,722, mailed May 11, 2012, 14 pages.
Notice of Allowance for U.S. Appl. No. 12/537,727, mailed Apr. 24, 2012, 14 pages.
Non-Final Office Action for U.S. Appl. No. 13/269,985, mailed Jun. 6, 2012, 19 pages.
Non-Final Office Action Response for U.S. Appl. No. 13/269,985, filed Apr. 4, 2012, 15 pages.
Non-Final Office Action Response for U.S. Appl. No. 12/537,725, filed Apr. 27, 2012, 12 pages.
Non-Final Office Action Response for U.S. Appl. No. 12/537,748, filed May 2, 2012, 13 pages.
Notice of Allowance for U.S. Appl. No. 12/537,725, mailed May 21, 2012, 18 pages.
Notice of Allowance for U.S. Appl. No. 13/269,183, mailed Apr. 19, 2012, 15 pages.
Notice of Allowance for U.S. Appl. No. 12/537,709, mailed Apr. 6, 2012, 14 pages.
Final Office Action for U.S. Appl. No. 12/537,719, mailed Apr. 9, 2012, 21 pages.
Non-Final Office Action Response for U.S. Appl. No. 12/537,722, filed Apr. 19, 2012, 12 pages.
Non-Final Office Action Response for U.S. Appl. No. 13/269,183, filed Mar. 27, 2012, 17 pages.
Non-Final Office Action Response for U.S. Appl. No. 12/537,709, filed Mar. 19, 2012, 15 pages.
Non-Final Office Action Response for U.S. Appl. No. 12/537,719, filed Feb. 29, 2012, 14 pages.
Non-Final Office Action Response for U.S. Appl. No. 12/537,727, filed Mar. 8, 2012, 11 pages.
Non-Final Office Action for U.S. Appl. No. 12/537,733, mailed Mar. 14, 2012, 23 pages.
Notice of Allowance for U.S. Appl. No. 13/269,972, mailed May 23, 2012, 18 pages.
Non-Final Office Action Response for U.S. Appl. No. 13/269,972, filed Apr. 4, 2012, 15 pages.
Final Office Action for U.S. Appl. No. 12/537,741, mailed Jul. 6, 2012, 22 pages.
Final Office Action for U.S. Appl. No. 12/537,704, mailed Apr. 6, 2012, 15 pages.
Non-Final Office Action for U.S. Appl. No. 12/537,704, mailed Nov. 28, 2011, 24 pages.
Non-Final Office Action Response for U.S. Appl. No. 12/537,704, filed Feb. 28, 2012, 16 pages.
Non-Final Office Action for U.S. Appl. No. 12/537,709, mailed Dec. 19, 2011, 28 pages.
Non-Final Office Action for U.S. Appl. No. 12/537,719, mailed Nov. 30, 2011, 29 pages.
Non-Final Office Action for U.S. Appl. No. 12/537,722, mailed Dec. 19, 2011, 25 pages.
Non-Final Office Action Response for U.S. Appl. No. 12/537,727, filed Aug. 31, 2011, 15 pages.
Final Office Action for U.S. Appl. No. 12/537,727, mailed Nov. 8, 2011, 13 pages.
Non-Final Office Action for U.S. Appl. No. 12/537,738, mailed Dec. 12, 2011, 25 pages.
Final Office Action for U.S. Appl. No. 12/537,741, mailed Dec. 21, 2011, 25 pages.
Non-Final Office Action for U.S. Appl. No. 12/537,748, mailed Dec. 12, 2011, 24 pages.
Non-Final Office Action for U.S. Appl. No. 12/755,968, mailed Jan. 26, 2012, 32 pages.
Non-Final Office Action for U.S. Appl. No. 13/269,183, mailed Dec. 27, 2011, 27 pages.
Non-Final Office Action for U.S. Appl. No. 13/269,972, mailed Jan. 5, 2012, 26 pages.
Non-Final Office Action for U.S. Appl. No. 13/269,985, mailed Jan. 6, 2012, 24 pages.
Paris, et al., "Evaluating the Impact of Irrecoverable Read Errors on Disk Array Reliability", 15th IEEE Pacific Rim International Symposium on Dependable Computing, Nov. 16-18, 2009, 6 pages.
Takeuchi, "Novel Co-Design of NAND Flash Memory and NAND Flash Controller Circuits for Sub-30 nm Low-Power High-Speed Solid-State Drives (SSD)", IEEE Journal of Solid-State Circuits, vol. A4, No. A, Apr. 2009, pp. 1227-1234.
Wen, et al, "A Processor-DMA-Based Memory Copy Hardware Accelerator" Sixth IEEE International Conference on Networking, Architecture and Storage (NAS), Jul. 30, 2011, pp. 225-229.
Non-Final Office Action for U.S. Appl. No. 12/537,725, mailed Jan. 30, 2012, 33 pages.
Non-Final Office Action Response for U.S. Appl. No. 12/537,727, filed Mar. 14, 2011, 11 pages.
Non-Final Office Action for U.S. Appl. No. 12/537,727, mailed on Jun. 3, 2011, 15 pages.
Non-Final Office Action for U.S. Appl. No. 12/537,727, mailed on Dec. 13, 2010, 20 pages.
Notice of Allowance for U.S. Appl. No. 12/756,009, mailed Jan. 11, 2013, 6 pages.
Non-Final Office Action Response for U.S. Appl. No. 12/756,477, filed Jan. 17, 2013, 10 pages.
Non-Final Office Action for U.S. Appl. No. 12/756,007, mailed Feb. 28, 2013, 10 pages.

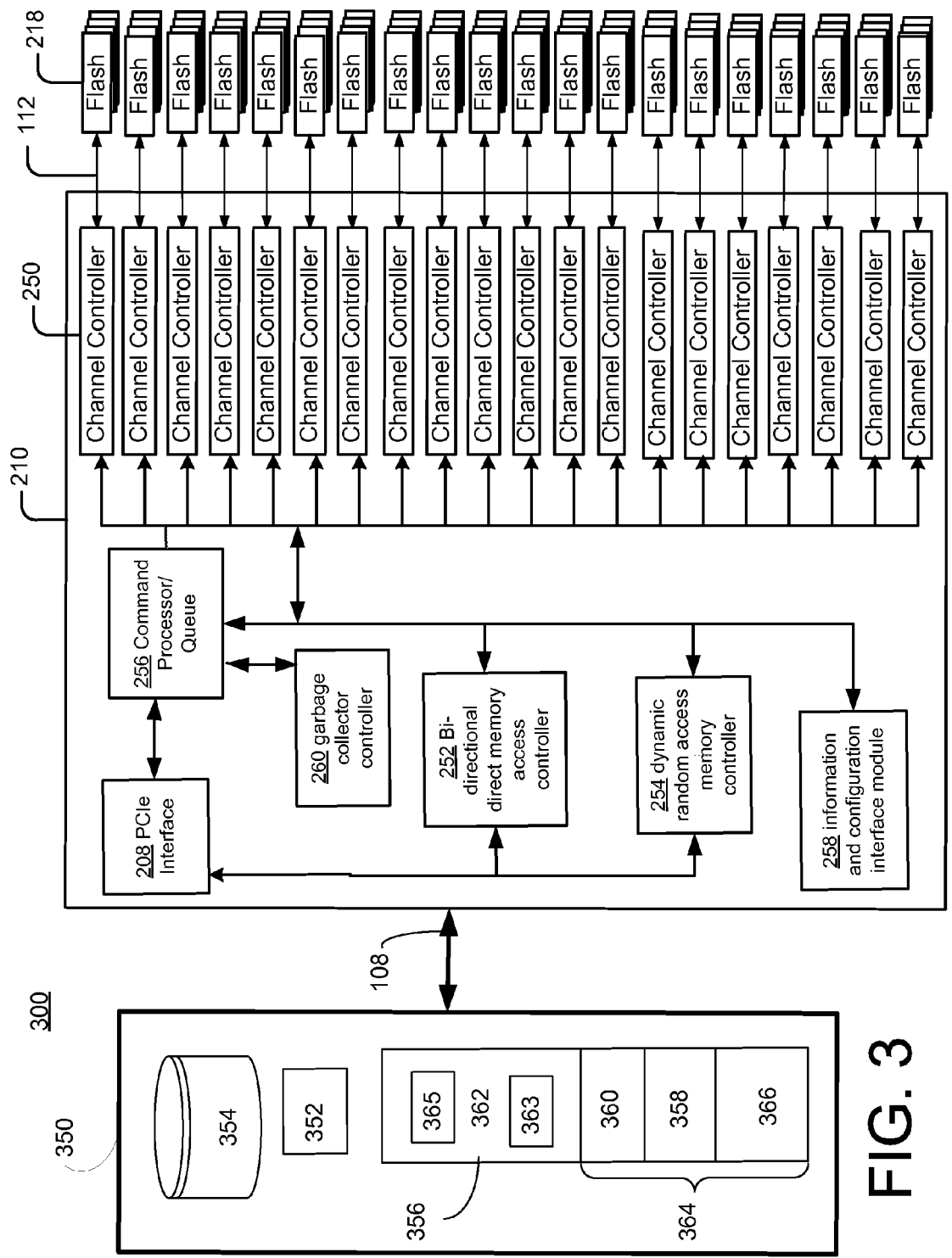

US 8,447,918 B2

GARBAGE COLLECTION FOR FAILURE PREDICTION AND REPARTITIONING

CROSS REFERENCE TO RELATED APPLICATIONS

This application claims the benefit of U.S. Provisional Application No. 61/167,709, filed Apr. 8, 2009, and titled "DATA STORAGE DEVICE" and U.S. Provisional Application No. 61/187,835, filed Jun. 17, 2009, and titled "PARTITIONING AND STRIPING IN A FLASH MEMORY DATA STORAGE DEVICE," U.S. Provisional Application No. 61/304,469, filed Feb. 14, 2010, and titled "DATA STORAGE DEVICE," U.S. Provisional Patent Application No. 61/304,468, filed Feb. 14, 2010, and titled "DATA STORAGE DEVICE," and U.S. Provisional Patent Application No. 61/304,475, filed Feb. 14, 2010, and titled "DATA STORAGE DEVICE," all of which are hereby incorporated by reference in entirety. Each of the above-referenced applications is hereby incorporated by reference in its entirety.

TECHNICAL FIELD

This description relates to a data storage device and, in particular, to garbage collection for failure prediction and repartitioning.

BACKGROUND

Data storage devices may be used to store data. A data storage device may be used with a computing device to provide for the data storage needs of the computing device. In certain instances, it may be desirable to store large amounts of data on a data storage device. Also, it may be desirable to execute commands quickly to read data from and to write data to the data storage device.

SUMMARY

In a first general aspect, a method of formatting a data storage device that includes a plurality of flash memory chips includes monitoring a failure rate of memory blocks of one or more flash memory chips of a storage device that has a first usable size for user space applications, estimating a future usable size of the data storage device based on the monitored failure rate, and defining, via a host coupled to the data storage device, a second usable size of the data storage device for user space applications based on the monitored failure rate.

Implementations can include one or more of the following features. Fore example, the method can further include writing the valid data stored on the data storage device to a location off of the data storage device, reformatting the data storage device to have the second usable size, and writing at least a portion of the valid data to the reformatted data storage device from the location back to the data storage device. Monitoring the failure rate of the memory blocks can include monitoring the failure rate of the memory blocks as a function of a number of write-erase cycles performed on the blocks. Monitoring the failure rate of the memory blocks can include storing information about the number of successful write-erase operations performed on the each of the memory blocks.

The method can further include monitoring an amount of valid data stored on the storage device, and defining the second usable size of the data storage device for user space applications can be additionally based on the amount of valid data stored on the storage device. Estimating the future usable size of the data storage device can include fitting data about the monitored failure rate of the memory blocks to a theoretical curve that characterizes a failure probability of a block.

The storage device can include a first partition that includes a first subset of the plurality of flash memory chips and a second partition that includes a second subset of the plurality of flash memory chips, and the first subset may not include any memory chips of the second subset, and the second subset may not include any memory chips of the first subset. Then, the method can further include monitoring a failure rate of memory blocks of one or more flash memory chips of the first partition, where the first partition has a first usable size for user space applications, estimating a future usable size of the first partition based on the monitored failure rate, and defining, via a host coupled to the data storage device, a second usable size of the first partition for user space applications based on the monitored failure rate. A usable size of the second partition can remain constant while the second usable size of the first partition is defined.

In another general aspect, a flash memory data storage device includes a plurality of flash memory chips and a host operably coupled to the data storage device via an interface. The host includes a wear monitoring engine configured to monitor a failure rate of memory blocks of one or more of the flash memory chips, a modeling engine configured to estimate a future usable size of the data storage device based on the monitored failure rate, and a formatting engine configured to format the data storage device to have a first usable size for user space applications and configured to format the data storage device to have a second usable size for user space applications based on the monitored failure rate.

Implementations can include one or more of the following features. For example, the formatting engine can be further configured to write valid data stored on the data storage device to a location off of the data storage device, reformat the data storage device to have the second usable size, and write at least a portion of the valid data to the reformatted data storage device from the location back to the data storage device. Monitoring the failure rate of the memory blocks can include monitoring the failure rate of the memory blocks as a function of a number of write-erase cycles performed on the blocks. The host can further include a memory configured to store information about the number of successful write-erase operations performed on the each of the memory blocks. The host can further include a configuration detection engine configured to monitor an amount of valid data stored on the storage device, and defining the second usable size of the data storage device for user space applications can be additionally based on the amount of valid data stored on the storage device. Estimating the future usable size of the data storage device can include fitting data about the monitored failure rate of the memory blocks to a theoretical curve that characterizes a failure of block.

The host can further include a partition engine configured to partition the data storage device into a first partition that includes a first subset of the plurality of flash memory chips and a second partition that includes a second subset of the plurality of flash memory chips, where the first subset does not include any memory chips of the second subset and where the second subset does not include any memory chips of the first subset. The wear monitoring engine can be further configured to monitor a failure rate of memory blocks of one or more flash memory chips of the first partition, where the first partition has a first usable size for user space applications, where the modeling engine is further configured to estimate a future usable size of the first partition based on the monitored failure rate, and where the formatting engine is further configured to define a second usable size of the first partition for user space applications based on the monitored failure rate. A usable size of the second partition can remain constant while the second usable size of the first partition is defined.

BRIEF DESCRIPTION OF THE DRAWINGS

FIG. 3 is an exemplary block diagram of a data storage system.

DETAILED DESCRIPTION

This document describes an apparatus, system(s) and techniques for data storage. Such a data storage apparatus may include a controller board having a controller that may be used with one or more different memory boards, with each of the memory boards having multiple flash memory chips. The data storage apparatus may communicate with a host using an interface on the controller board. In this manner, the controller on the controller board may be configured to receive commands from the host using the interface and to execute those commands using the flash memory chips on the memory boards.

Figure 1:
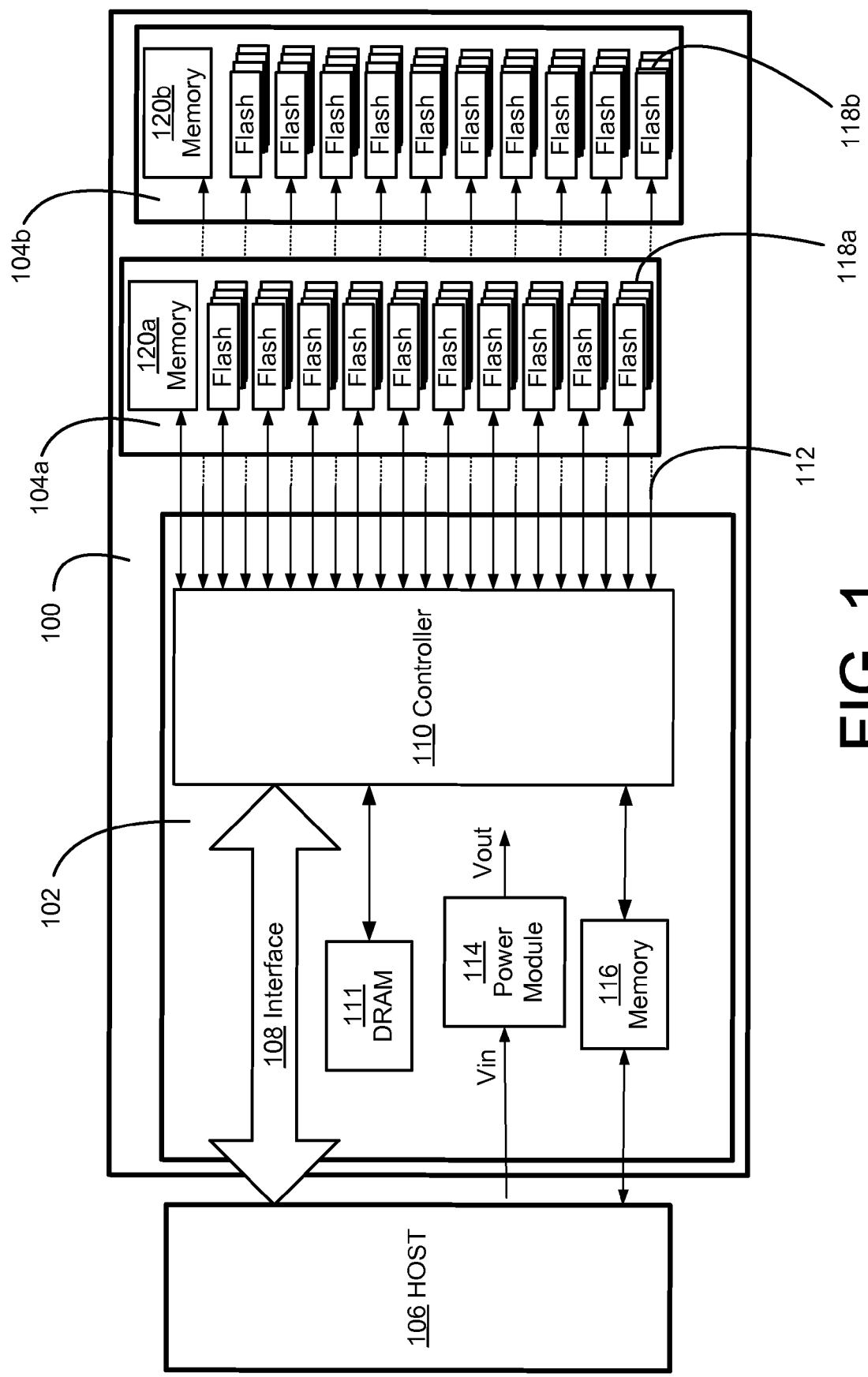
FIG. 1 is an exemplary block diagram of a data storage device.

FIG. 1 is a block diagram of a data storage device 100. The data storage device 100 may include a controller board 102 and one or more memory boards 104a and 104b. The data storage device 100 may communicate with a host 106 over an interface 108. The interface 108 may be between the host 106 and the controller board 102. The controller board 102 may include a controller 110, a DRAM 111, multiple channels 112, a power module 114, and a memory module 116. The memory boards 104a and 104b may include multiple flash memory chips 118a and 118b on each of the memory boards. The memory boards 104a and 104b also may include a memory device 120a and 120b.

In general, the data storage device 100 may be configured to store data on the flash memory chips 118a and 118b. The host 106 may write data to and read data from the flash memory chips 118a and 118b, as well as cause other operations to be performed with respect to the flash memory chips 118a and 118b. The reading and writing of data between the host 106 and the flash memory chips 118a and 118b, as well as the other operations, may be processed through and controlled by the controller 110 on the controller board 102. The controller 110 may receive commands from the host 106 and cause those commands to be executed using the flash memory chips 118a and 118b on the memory boards 104a and 104b. The communication between the host 106 and the controller 110 may be through the interface 108. The controller 110 may communicate with the flash memory chips 118a and 118b using the channels 112.

The controller board 102 may include DRAM 111. The DRAM 111 may be operably coupled to the controller 110 and may be used to store information. For example, the DRAM 111 may be used to store logical address to physical address maps and bad block information. The DRAM 111 also may be configured to function as a buffer between the host 106 and the flash memory chips 118a and 118b.

In one exemplary implementation, the controller board 102 and each of the memory boards 104a and 104b are physically separate printed circuit boards (PCBs). The memory board 104a may be on one PCB that is operably connected to the controller board 102 PCB. For example, the memory board 104a may be physically and/or electrically connected to the controller board 102. Similarly, the memory board 104b may be a separate PCB from the memory board 104a and may be operably connected to the controller board 102 PCB. For example, the memory board 104b may be physically and/or electrically connected to the controller board 102.

The memory boards 104a and 104b each may be separately disconnected and removable from the controller board 102. For example, the memory board 104a may be disconnected from the controller board 102 and replaced with another memory board (not shown), where the other memory board is operably connected to controller board 102. In this example, either or both of the memory boards 104a and 104b may be swapped out with other memory boards such that the other memory boards may operate with the same controller board 102 and controller 110.

In one exemplary implementation, the controller board 102 and each of the memory boards 104a and 104b may be physically connected in a disk drive form factor. The disk drive form factor may include different sizes such as, for example, a 3.5" disk drive form factor and a 2.5" disk drive form factor.

In one exemplary implementation, the controller board 102 and each of the memory boards 104a and 104b may be electrically connected using a high density ball grid array (BGA) connector. Other variants of BGA connectors may be used including, for example, a fine ball grid array (FBGA) connector, an ultra fine ball grid array (UBGA) connector and a micro ball grid array (MBGA) connector. Other types of electrical connection means also may be used.

The interface 108 may include a high speed interface between the controller 110 and the host 106. The high speed interface may enable fast transfers of data between the host 106 and the flash memory chips 118a and 118b. In one exemplary implementation, the high speed interface may include a Peripheral Component Interconnect Express ("PCIe") interface. For instance, the PCIe interface may be a PCIe x4 interface or a PCIe x8 interface. The PCIe interface 108 may include a PCIe connector cable assembly to the host 106. In this example, the 110 may include an interface controller configured to interface between the host 106 and the interface 108. The interface controller may include a PCIe endpoint controller. Other high speed interfaces, connectors, and connector assemblies also may be used.

In one exemplary implementation, the communication between the controller board 102 and the flash memory chips 118a and 118b on the memory boards 104a and 104b may be arranged and configured into multiple channels 112. Each of the channels 112 may communicate with one or more flash memory chips 118a and 118b. The controller 110 may be configured such that commands received from the host 106 may be executed by the controller 110 using each of the channels 112 simultaneously or at least substantially simultaneously. In this manner, multiple commands may be executed simultaneously on different channels 112, which may improve throughput of the data storage device 100.

In the example of FIG. 1, twenty (20) channels 112 are illustrated. The completely solid lines illustrate the ten (10) channels between the controller 110 and the flash memory chips 118a on the memory board 104a. The mixed solid and dashed lines illustrate the ten (10) channels between the controller 110 and the flash memory chips 118b on the memory board 104b. As illustrated in FIG. 1, each of the channels 112 may support multiple flash memory chips. For instance, each of the channels 112 may support up to 32 flash memory chips. In one exemplary implementation, each of the 20 channels may be configured to support and communicate with 6 flash memory chips. In this example, each of the memory boards 104a and 104b would include 60 flash memory chips each. Depending on the type and the number of the flash memory chips 118a and 118b, the data storage 100 device may be configured to store up to and including multiple terabytes of data.

The controller 110 may include a microcontroller, a FPGA controller, other types of controllers, or combinations of these controllers. In one exemplary implementation, the controller 110 is a microcontroller. The microcontroller may be implemented in hardware, software, or a combination of hardware and software. For example, the microcontroller may be loaded with a computer program product from memory (e.g., memory module 116) including instructions that, when executed, may cause the microcontroller to perform in a certain manner. The microcontroller may be configured to receive commands from the host 106 using the interface 108 and to execute the commands. For instance, the commands may include commands to read, write, copy and erase blocks of data using the flash memory chips 118a and 118b, as well as other commands.

In another exemplary implementation, the controller 110 is a FPGA controller. The FPGA controller may be implemented in hardware, software, or a combination of hardware and software. For example, the FPGA controller may be loaded with firmware from memory (e.g., memory module 116) including instructions that, when executed, may cause the FPGA controller to perform in a certain manner. The FPGA controller may be configured to receive commands from the host 106 using the interface 108 and to execute the commands. For instance, the commands may include commands to read, write, copy and erase blocks of data using the flash memory chips 118a and 118b, as well as other commands.

The memory module 116 may be configured to store data, which may be loaded to the controller 110. For instance, the memory module 116 may be configured to store one or more images for the FPGA controller, where the images include firmware for use by the FPGA controller. The memory module 116 may interface with the host 106 to communicate with the host 106. The memory module 116 may interface directly with the host 106 and/or may interface indirectly with the host 106 through the controller 110. For example, the host 106 may communicate one or more images of firmware to the memory module 116 for storage. In one exemplary implementation, the memory module 116 includes an electrically erasable programmable read-only memory (EEPROM). The memory module 116 also may include other types of memory modules.

The memory boards 104a and 104b may be configured to operate with different types of flash memory chips 118a and 118b. In one exemplary implementation, the flash memory chips 118a and the flash memory chips 118b may be the same type of flash memory chips including requiring the same voltage from the power module 114 and being from the same flash memory chip vendor. The terms vendor and manufacturer are used interchangeably throughout this document.

In another exemplary implementation, the flash memory chips 118a on the memory board 104a may be a different type of flash memory chip from the flash memory chips 118b on the memory board 104b. For example, the memory board 104a may include SLC NAND flash memory chips and the memory board 104b may include MLC NAND flash memory chips. In another example, the memory board 104a may include flash memory chips from one flash memory chip manufacturer and the memory board 104b may include flash memory chips from a different flash memory chip manufacturer. The flexibility to have all the same type of flash memory chips or to have different types of flash memory chips enables the data storage device 100 to be tailored to different applications being used by the host 106.

In another exemplary implementation, the memory boards 104a and 104b may include different types of flash memory chips on the same memory board. For example, the memory board 104a may include both SLC NAND chips and MLC NAND chips on the same PCB. Similarly, the memory board 104b may include both SLC NAND chips and MLC NAND chips. In this manner, the data storage device 100 may be advantageously tailored to meet the specifications of the host 106.

In another exemplary implementation, the memory board 104a and 104b may include other types of memory devices, including non-flash memory chips. For instance, the memory boards 104a and 104b may include random access memory (RAM) such as, for instance, dynamic RAM (DRAM) and static RAM (SRAM) as well as other types of RAM and other types of memory devices. In one exemplary implementation, both of the memory boards 104a and 104b may include RAM. In another exemplary implementation, one of the memory boards may include RAM and the other memory board may include flash memory chips. Also, one of the memory boards may include both RAM and flash memory chips.

The memory modules 120a and 120b on the memory boards 104a and 104b may be used to store information related to the flash memory chips 118a and 118b, respectively. In one exemplary implementation, the memory modules 120a and 120b may store device characteristics of the flash memory chips. The device characteristics may include whether the chips are SLC chips or MLC chips, whether the chips are NAND or NOR chips, a number of chip selects, a number of blocks, a number of pages per block, a number of bytes per page and a speed of the chips.

In one exemplary implementation, the memory modules 120a and 120b may include serial EEPROMs. The EEPROMs may store the device characteristics. The device characteristics may be compiled once for any given type of flash memory chip and the appropriate EEPROM image may be generated with the device characteristics. When the memory boards 104a and 104b are operably connected to the controller board 102, then the device characteristics may be read from the EEPROMs such that the controller 110 may automatically recognize the types of flash memory chips 118a and 118b that the controller 110 is controlling. Additionally, the device characteristics may be used to configure the controller 110 to the appropriate parameters for the specific type or types of flash memory chips 118a and 118b.

In an example embodiment, the data storage device 100 may be used to store large amounts of data (e.g., many Gigabytes or Terabytes of data) that must be read quickly from the data storage device 100 and supplied to the host 106. For example, the data storage device 100 can be used to cache large volumes of publicly accessible information (e.g., a large corpus of web pages from the World Wide Web, a large library of electronic versions of books, or digital information representing a large volume of telecommunications, etc.) that can be fetched by the host in response to a query. In another example, the data storage device 100 can be used to store an index of publically accessible documents, where the index can be used to locate the documents in response to a query. Thus, it can be important that the relevant data be accessed and returned very quickly in response to a read command issued by the host. However, the information stored in the data storage device also may need to be constantly updated to keep the information up to date as the relevant information changes. For example, if the information on the storage device relates to a corpus of web pages, the information stored on the storage device may need to be updated as the web pages change and as new web pages are created.

Figure 2:
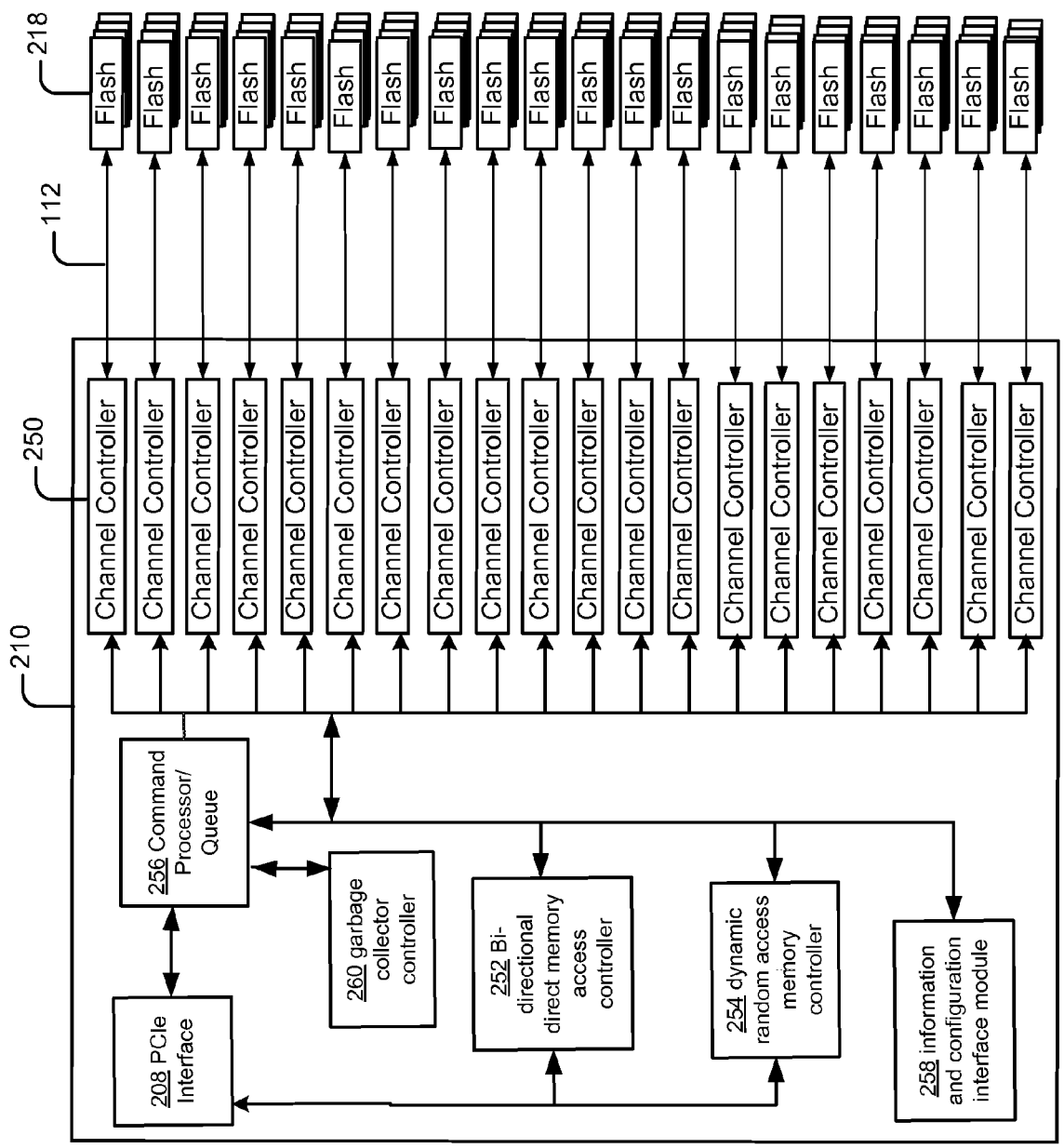
FIG. 2 is an exemplary block diagram of a FPGA controller that can be used in a data storage device.

As discussed above, the controller 110 may include a FPGA controller. Referring to FIG. 2, an exemplary block diagram of a FPGA controller 210 is illustrated. The FPGA controller may be configured to operate in the manner described above with respect to controller 110 of FIG. 1. The FPGA controller 210 may include multiple channel controllers 250 to connect the multiple channels 112 to the flash memory chips 218. The flash memory chips 218 are illustrated as multiple flash memory chips that connect to each of the channel controllers 250. The flash memory chips 218 are representative of the flash memory chips 118a and 118b of FIG. 1, which are on the separate memory boards 104a and 104b of FIG. 1. The separate memory boards are not shown in the example of FIG. 2. The FPGA controller 210 may include a PCIe interface module 208, a bi-directional direct memory access (DMA) controller 252, a dynamic random access memory (DRAM) controller 254, a command processor/queue 256, an information and configuration interface module 258, and a garbage collector controller 260.

Information may be communicated with a host (e.g., host 106 of FIG. 1) using an interface. In the example shown in FIG. 2, the FPGA controller 210 includes a PCIe interface to communicate with the host and a PCIe interface module 208. The PCIe interface module 208 may be arranged and configured to receive commands from the host and to send commands to the host. The PCIe interface module 208 may provide data flow control between the host and the data storage device. The PCIe interface module 208 may enable high speed transfers of data between the host and the controller 210 and ultimately the flash memory chips 218. In one exemplary implementation, the PCIe interface and the PCIe interface module 208 may include a 64-bit bus. The bi-directional direct memory access (DMA) controller 252 may be arranged and configured to control the operation of the bus between the PCIe interface module 208 and the command processor/queue 256.

The bi-directional DMA controller 252 may be configured to interface with the PCIe interface 208, and each of the channel controllers 250. The bi-directional DMA controller 252 enables bi-directional direct memory access between the host 106 and the flash memory chips 218.

The DRAM controller 254 may be arranged and configured to control the translation of logical to physical addresses. For example, in an implementation in which the host addresses the memory space using logical addresses, the DRAM controller 254 may assist the command processor/queue 256 with the translation of the logical addresses used by the host to the actual physical addresses in the flash memory chips 218 related to data being written to or read from the flash memory chips 218. A logical address received from the host may be translated to a physical address for a location in one of the flash memory chips 218. Similarly, a physical address for a location in one of the flash memory chips 218 may be translated to a logical address and communicated to the host.

The command processor/queue 256 may be arranged and configured to receive the commands from the host through the PCIe interface module 208 and to control the execution of the commands through the channel controllers 250. The command processor/queue 256 may maintain a queue for a number of commands to be executed and order the commands using an ordered list to ensure that the oldest commands may be processed first. The command processor 100 may maintain the order of the commands designated for the same flash memory chip and may reorder the commands designated for different flash memory chips. In this manner, multiple commands may be executed simultaneously and each of the channels 112 may be used simultaneously or at least substantially simultaneously.

The command processor/queue 256 may be configured to process commands for different channels 112 out of order and preserve per-channel command ordering. For instance, commands that are received from the host and that are designated for different channels may be processed out of order by the command processor/queue 256. In this manner, the channels may be kept busy. Commands that are received from the host for processing on the same channel may be processed in the order that the commands were received from the host by the command processor/queue 256. In one exemplary implementation, the command processor/queue 256 may be configured to maintain a list of commands received from the host in an oldest-first sorted list to ensure timely execution of the commands.

The channel controllers 250 may be arranged and configured to process commands from the command processor/queue 256. Each of the channel controllers 250 may be configured to process commands for multiple flash memory chips 218. In one exemplary implementation, each of the channel controllers 250 may be configured to process commands for up to and including 32 flash memory chips 218.

The channel controllers 250 may be configured to process the commands from the command processor/queue 256 in order as designated by the command processor/queue 256. Examples of the commands that may be processed include, but are not limited to, reading a flash page, programming a flash page, copying a flash page, erasing a flash block, reading a flash block's metadata, mapping a flash memory chip's bad blocks, and resetting a flash memory chip.

The information and configuration interface module 258 may be arranged and configured to interface with a memory module (e.g., memory module 116 of FIG. 1) to receive configuration information for the FPGA controller 210. For example, the information and configuration interface module 258 may receive one or more images from the memory module to provide firmware to the FPGA controller 210. Modifications to the images and to the firmware may be provided by the host to the controller 210 through the information and configuration interface module 258. Modifications received through the information and configuration interface module 258 may be applied to any of the components of the controller 210 including, for example, the PCIe interface module 208, the bi-directional direct memory access (DMA) controller 252, the DRAM controller 254, the command processor/queue 256 and the channel controllers 250. The information and configuration interface module 258 may include one or more registers, which may be modified as necessary by instructions from the host.

The FPGA controller 210 may be arranged and configured to cooperate and process commands in conjunction with the host. The FPGA controller 210 may perform or at least assist in performing error correction, bad block management, logical to physical mapping, garbage collection, wear levelling, partitioning and low level formatting related to the flash memory chips 218.

The garbage collection controller 260 of the FPGA controller 210 can be used to coordinate and control garbage collection operations on the data storage device 100. As discussed above, cells of memory chips 218 are organized in block units and each block includes a plurality of pages. Data can be written to and read from a memory chip 218 in page-sized units, but when data is erased from a memory chip 218 is be erased in block-sized units. In addition, flash memory chips 218 cannot be updated in-place—that is, data written to a page of a chip cannot be overwritten by new data. Instead, the new data must be written to a different location, and the old data must be declared in valid. Because of these constraints, when updating of data on the data storage device an out-of-place updating scheme must be used in which the new data are written to a different physical location than the old data, and then the old data are declared invalid.

Thus, pages of flash memory chips 218 can have one of three states: (1) free (wherein the page contains no data and is available to store new or updated data; (2) valid (wherein the page contains new or recently updated data that is available to be read); or (3) invalid (wherein the page contains obsolete data or data marked for deletion). As one can imagine, after some cycles of updating data on a flash memory chip 218 using the out-of-place updating procedure, many blocks will have both valid and invalid pages, which reduces the number of free pages available to receive new or updated data.

Therefore, a garbage collection process is used to reclaim free pages on a memory chip. In a garbage collection process, a block is targeted for having all of its data erased, so that the pages of the block can be reclaimed as free pages. Before erasing the pages of the block, the valid pages of the block are copied to a new location into free pages of one or more different blocks or one or more different chips 218. After all the valid pages of the targeted block are successfully copied to the new locations, the pages are of the targeted block are erased, so that they are free to have data written to them.

Garbage collection is important for using a flash memory device, but garbage collection is also time-consuming. This is because in a flash memory storage device, write operations to a flash memory chip take much longer (e.g., approximately 10 times longer) than read operations from a flash memory chip, and because erase operations take much longer (e.g., approximately 10 times longer) than write operations operations. Thus, the interleaving garbage collection operations with the read operations associated with reading a file from the data storage device 100 to the host 106 can significantly delay the reading of the data file from the data storage device to the host.

Garbage collection can be performed when it is necessary to reclaim free space on a memory chip in order to write new or updated data to the chip. For example, if the chip contains fewer free pages than are necessary to receive the data that is intended to be written to the chip, then garbage collection must be performed to erase enough blocks to reclaim a sufficient number of pages to receive the data to be written to the chip.

Alternatively, garbage collection can be performed in background operations to periodically erase blocks and to maintain the number of invalid pages at a relatively low amount, so that a sufficient number of free pages exist to receive data to be written to the memory chip 218. Thus, the garbage collector controller 260 can monitor the read and/or write operations that are being performed on a block of a memory chip 218, and perform garbage collection in view of the monitored activity. For example, if such operations are not being performed, the garbage collector controller 260 can instruct the command processor/queue 256 to initiate a garbage collection process on a targeted block, which might be targeted based on the number of invalid pages on the block. In another example, the rate of read and/or write operations can be monitored by the garbage collector controller 260, and if the rate of read and/or write operations is below a threshold value the garbage collector controller 260 can instruct the command processor/queue 256 to initiate a garbage collection process on a targeted block. In addition to monitoring the read or write operations at the per memory block level, the garbage collector 260 also may monitor read or write operations on a per memory chip level or a per channel level, and can perform background garbage collection in view of the monitored operations.

However, because garbage collection is so time-consuming compared to read operations and even compared to write operations, and because read and write performance are important performance metrics for the data storage device 100, background garbage collection can be suppressed or limited by the host 106 at certain times to improve the read and/or write performance of the data storage device 100.

FIG. 3 is a schematic block diagram of a data storage apparatus 300 that includes a host 350 and the data storage device 210. As described above, the data storage device 210 can be connected to the host 350 though an interface 308, which can be a high speed interface, such as, for example a PCIe interface. The host can include, for example, a processor 352, a first memory 354, a second memory 356, and a host activity monitoring engine 360. The first memory 354 can include, for example, a non-volatile memory device (e.g., a hard disk) adapted for storing machine-readable, executable code instructions that can be executed by the processor 352. The code instructions stored on the first memory 354 can be loaded into the second memory (e.g., a volatile memory, such as, a random access memory) 356 where they can be executed by the processor 352 to create the garbage collection control engine 358 and the host activity monitoring engine 360. The second memory can include logical blocks of "user space" 362 devoted to user mode applications and logical blocks of "kernel space" 364 devoted to running the lower-level resources that user-level applications must control to perform their functions. The garbage collection control engine 358 and the host activity monitoring engine 360 can reside in the kernel space 364 of the second memory 356.

The host activity monitoring engine 360 can be configured to monitor activity of the host 106. The garbage collection control engine 358 can be configured to control the background garbage collection performed by the data storage device's background garbage collector 260. For example, in one implementation, the host activity monitoring engine 360 can determine a usage level of a processor (e.g., processor 352) of the host 106, where, in one implementation, the processor may be involved in the transfer of data between the host 106 and the data storage device 210. For example, the usage level may include a percentage of a predefined capacity at which the processor operates or a rate at which the processor executes operations. The determined usage level can be compared to a predetermined usage level. When the usage level exceeds the predetermined usage level, the garbage collection control engine 358 can limit an amount of cycles of a processor (e.g., a processor that executes the read, write, copy, and erase operations) of the data storage device 210, which are devoted to background garbage collection in response to the determination that the usage level exceeds the predetermined level. The garbage collection control engine 358 may provide this limit by sending a signal to the data storage device's background garbage collector 260 instructing it to halt background garbage collection to limit background garbage collection below the threshold amount so as not to exceed the predetermined level.

In another implementation, the host activity monitoring engine 360 can monitor a rate at which data is read from the memory device 210 to the host 106. The monitoring engine can further determine if the rate of reading data exceeds a predetermined rate. If so, then the garbage collection control engine 358 can control background garbage collection of memory blocks of the memory device 210 in response to the monitored activity by halting the background garbage collection while the rate of reading data exceeds the predetermined level. In this manner, background garbage collection can be suppressed during bursts of reading data from the data storage device 210 to the host 350.

In another implementation, the garbage collection control engine 358 can pro-actively control background garbage collection on the data storage device 210. For example, the host may know that a number of important read events will be occurring soon, which should not be interrupted by background garbage collection on the data storage device. In such a case, host activity monitoring engine 360 may receive a signal (e.g., from the processor 352 that may be executing an application layer program that resides in the user space portion 362 of the memory 364) that certain read events will occur in which data will be read from the memory device 210 to the host 350. Then, the host activity monitoring engine 360 can inform the garbage collection control engine 358 of the anticipated read events. In response, the garbage collection control engine 358 can control background garbage collection of memory blocks of the memory device by limiting an amount of effort devoted to background garbage collection in comparison to an amount of effort devoted to reading data from the memory device to the host in response to receipt of the signal. Again, the garbage collection control engine 358 may provide this limit by sending a signal to the data storage device's background garbage collector 260 instructing it to halt background garbage collection to limit background garbage collection below the threshold amount. For example, an amount of garbage collection or erase events may be limited below a certain percentage of read and/or write events. After the identified important read events have occurred then the limitation on background garbage collection can be lifted. For example, the host may send a signal to instruct the garbage collector 260 of the memory device 210 that the limitation on background garbage collection has been ended.

In one implementation, the host can include a query handler 363 operating in user space 362 that is configured to receive a query for one or more documents that reside on the data storage device 302. Then, while one or more of the documents are being retrieved from the data storage device 210 to the host 350, the garbage collection control engine 358 can block background garbage collection that occurs on the data storage device until the documents have been retrieved.

As described above, the memory device 210 can include a plurality of memory chips 218 and a plurality of channels 112, each of which is operable connected to a plurality of memory chips. The garbage collector 260 can be configured to perform, at different times, garbage collection on blocks of specific memory chips but not on blocks of other memory chips, or on blocks of memory chips 218 connected to specific channels 112 but not on blocks of memory chips 218 connected to other channels 112. Because of this, the garbage collection control engine 358 be configured to control the background garbage collection performed by the data storage device's garbage collector 260 by differentially controlling the amount of background garbage collection on different ones of the plurality of memory chips 218 or by differentially controlling the amount of background garbage collection on chips connected to different ones of the plurality of channels 112. That, is the background garbage collection can be limited on certain chips or channels that are experiencing, or that are expected to experience, high rates of read events, while unlimited background garbage collection is allowed to proceed on other chips or chips connected to other channels.

In another implementation, garbage collection, rather than being performed by a garbage collector 260 residing on the controller 210, can be controlled and performed from the host 350. For example, the garbage collection control engine 358, in addition to limiting the amount of processor cycles that are devoted to background garbage collection in response to a determination that a usage level exceeds a predetermined level, also can perform the garbage collection functions that are described above as being performed, in a particular implementation, by the garbage collector 260. Thus, the garbage collection control engine 358 on the host 350 can monitor the read and/or write operations that are being performed on a block of a memory chip 218, and can perform garbage collection in view of the monitored activity. For example, if such operations are not being performed, the garbage collection control engine 358 can instruct the command processor/queue 256 of the controller 210 to initiate a garbage collection process on a targeted block, which might be targeted based on the number of invalid pages on the block. In another example, the rate of read and/or write operations can be monitored by the garbage collection control engine 358, and if the rate of read and/or write operations is below a threshold value the garbage collection control engine 358 can instruct the command processor/queue 256 to initiate a garbage collection process on a targeted block. In addition to monitoring the read or write operations at the per memory block level, the garbage collection control engine 358 also can monitor read or write operations on a per memory chip level or a per channel level, and can perform background garbage collection in view of the monitored operations.

Figure 4A:
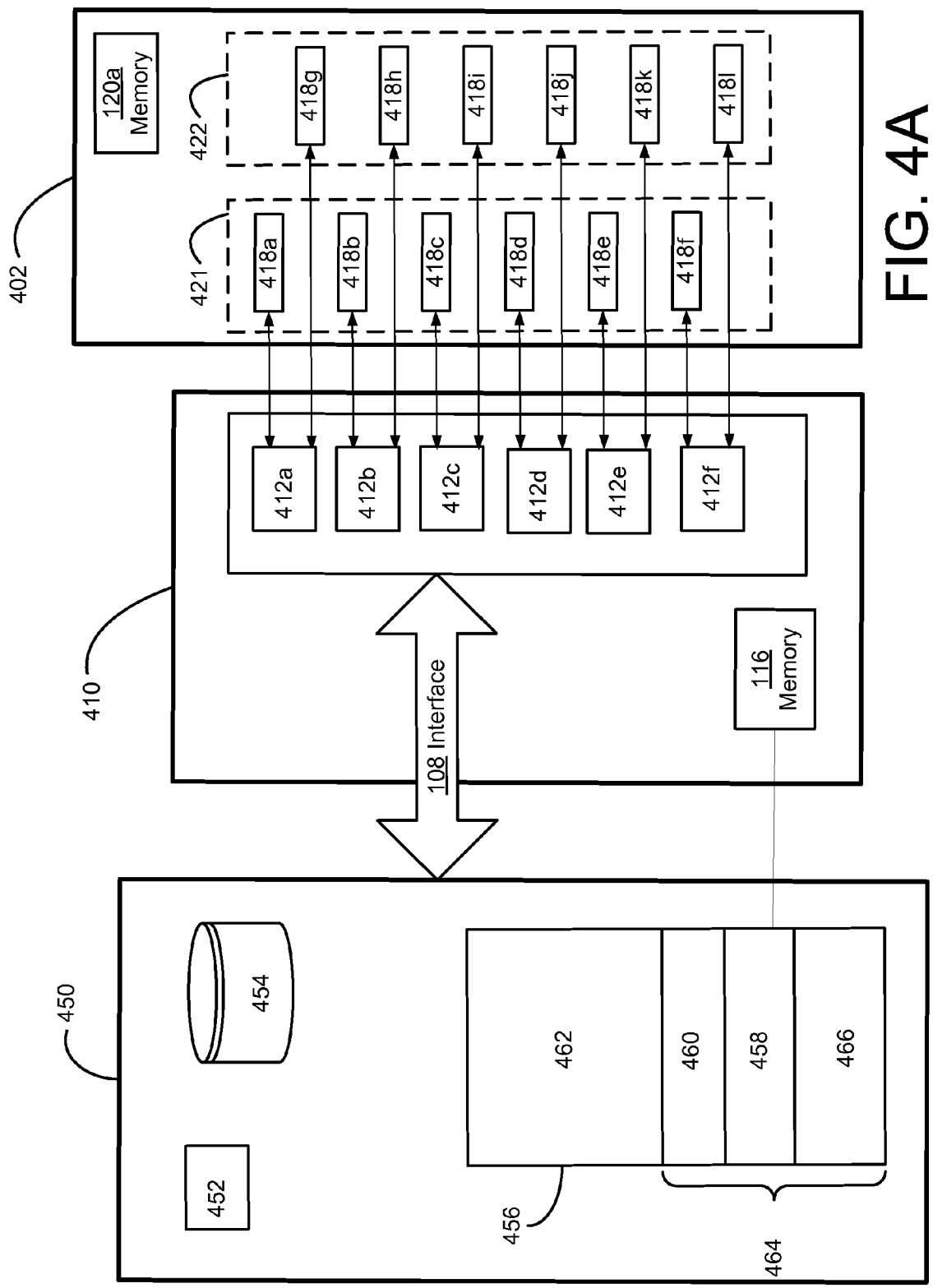
FIG. 4A is an exemplary block diagram of exemplary computing devices for use with a data storage device.

FIG. 4A is a schematic block diagram of an apparatus 400 including a data storage device 402 having a plurality of flash memory chips 418a, 418b, 418c, 418d, 418e, 418f, 418g, 418h, 418i, 418j, 418k, 418l that are organized into a first partition 421 and a second partition 422. The first and second partition 421 and 422 define different physical areas of storage space in the data storage device 402, such that directories and files of different categories can be stored in the different partitions, or so that one partition can be used for different purposes than the other partition. The first partition can include a first subset of the flash memory chips 418a-f, while the second partition can include a second subset of the flash memory chips 418g-l, where there are not any flash memory chips that are part of both partitions. That is, the boundary between the partitions 421 and 422 is drawn between individual flash memory chips to ensure that an individual flash memory chip does not belong to more than one partition.

Organizing the data storage device into two or more partitions can serve a number of purposes. For example, operating system file stored on one partition can be kept separate from user files stored on another partition. Cache and log files that can change size dynamically and rapidly, potentially making a file system full, can be stored on one partition and kept separate from other files stored on a different partition. Partitions can be used for multi-booting setups, which allow users to have more than one operating system on a single computer. For example, a user could install Linux, Mac OS X, and Microsoft Windows or operating systems on different partitions of the same data storage device and have a choice of booting into any operating system (supported by the hardware) at power-up. Partitions can be used to protect or isolate files to make it easier to recover a corrupted file system or operating system installation. For example if one partition is corrupted but none of the other file systems are affected, the data on the storage device may still be salvageable. Using a separate partition for read-only data also reduces the chances of the file system on that partition becoming corrupted. Partitions also can raise overall computer performance on systems where smaller file systems are more efficient. For example, large hard drives with only one NTFS file system typically have a very large sequentially-accessed Master File Table (MFT), and it generally takes more time to read this MFT than the smaller MFTs of smaller partitions.

In another example embodiment, the data storage device 402 may be used to store large amounts of data (e.g., many Gigabytes or Terabytes of data) that must be read quickly from the data storage device and supplied to the host. For example, the data storage device can be used to cache large volumes of publicly accessible information (e.g., a large corpus of web pages from the World Wide Web, a large library of electronic versions of books, or digital information representing a large volume of telecommunications, etc.) that can be fetched by the host in response to a query. Thus, it can be important that the relevant data be accessed and returned very quickly in response to a read command issued by the host. However, the information stored in the data storage device also may need to be constantly updated to keep the information up to date as the relevant information changes. For example, if the information on the storage device relates to a corpus of web pages, the information stored on the storage device may need to be updated as the web pages change and as new web pages are created.

In such a system, a partitioned flash memory data storage device 402 can offer exceptional performance. In a flash memory storage device, write operations to a flash memory chip take much longer (e.g., 10-100 times longer) than read operations from a flash memory chip. Therefore, organizing the chips 418a-l of the data storage device into two or more partitions, where the partitions are defined at boundaries between different chips, offers a way to ensure fast read operations while also allowing the information stored on the data storage device to be updated in real time. For example, both partitions 421 and 422 can be used to store a corpus of data (e.g., a corpus of web pages) to be served in response to queries and the individual partitions can alternate between serving the requests and being updated with new information. For instance, in a first time period the first partition 421 can be used to provide the information to the host (e.g., information that may be requested in response to a user query), while the data on the second partition 422 is updated (e.g., in response to changes or additions to the web pages of the corpus). Then, in a second time period, the recently updated second partition 422 can be used to provide the information to the host, while the data on the first partition 421 is updated. This process can be repeated so that data is always served from a partition that acts as a read-only device, and therefore provides very fast responses to read commands from the host without being slowed down by write commands, while the other partition is being updated with new information. Defining the partitions such that an individual flash memory chip is included in only one partition ensures that no flash chip will have data written to it and read from it at substantially the same time, which would cause a delay is responding to a read request from the host 450.

As discussed above, the memory chips 418a-l can be connected to a controller that may include a FPGA controller 410. The FPGA controller may be configured to operate in the manner described above with respect to controller 110 of FIG. 1 or of FPGA 210 of FIG. 2. The FPGA controller 410 may include multiple channel controllers 412a, 412b, 412c, 412d, 412e, 412f to connect the multiple channels 112 to the flash memory chips 418a-l. Of course, as described above, the storage device can include more than 12 flash memory chips, more than six channel controllers, and many more than two flash memory chips may be operably connected to a channel controller across a physical channel. Thus, the implementation shown in FIGS. 4A and 4B is merely schematic for clarity of illustration.

In one implementation, channel controllers 412a, 412b, 412c, 412d, 412e, 412f can control channels that are operably connected to flash memory chips that are part of each partition 421 and 422. For example, channel controller 412a can be operably connected to memory chip 418a, which is part of the first partition 421, and also to memory chip 418g, which is part of the second partition 422. In such a configuration, at least one memory chip in the first partition 421 is connected to each communication channel between the data storage device 402 and the host, and at least one memory chip in the second partition 422 is connected to each communication channel between the data storage device 402 and the host 450. Such a configuration results in maximum parallelism of communication between a partition 421 or 422 and the host, which can result in fast read access and fast write times from and to the data storage device 402.

In another implementation, approximately half the channel controllers can be operably connected to flash memory chips in a first partition and approximately half the channel controllers can be operably connected to flash memory chips in the second partition.

Figure 4B:
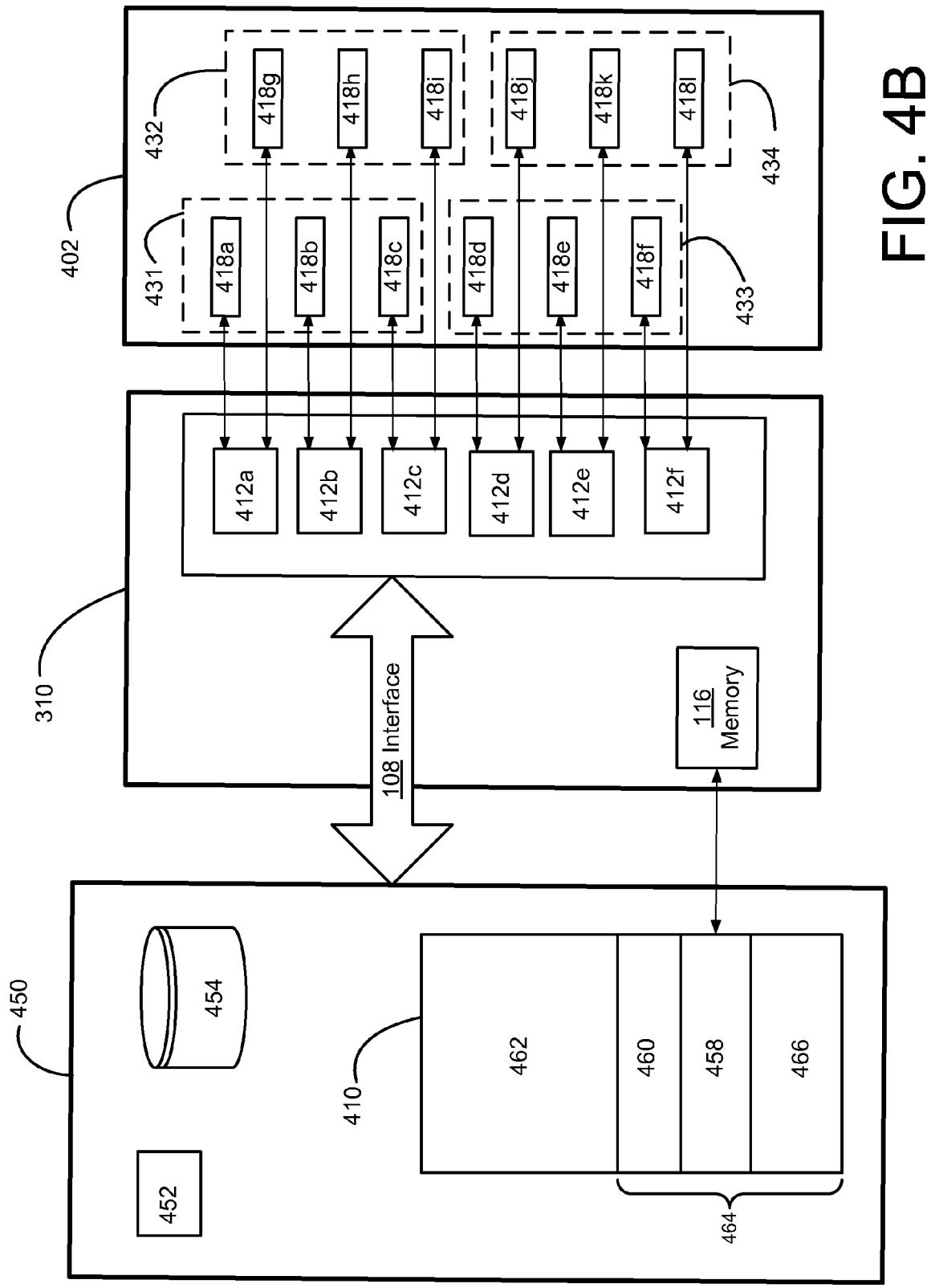
FIG. 4B is an exemplary block diagram of exemplary computing devices for use with a data storage device.

In another implementation, shown in FIG. 4B, flash memory chips 418a, 418b, 418c, 418d, 418e, 418f, 418g, 418h, 418i, 418j, 418k, 418l can be organized into a first partition 431, a second partition 422, a third partition 433, and a fourth partition 434, where the different partitions define different physical areas of storage space in the data storage device 402, such that directories and files of different categories can be stored in the different partitions, or so that one partition can be used for different purposes than the other partition. The first partition 431 can include a first subset of the flash memory chips 418a-c. The second partition 432 can include a second subset of the flash memory chips 418d-f. The third partition 433 can include a third subset of the flash memory chips 418g-i. The fourth partition 434 can include a fourth subset of the flash memory chips 418j-l. Among the different partitions 431, 432, 433, and 434 there are not any individual flash memory chips whose physical memory address space is part of two or more partitions. That is, the boundaries between the partitions 431, 432, 433, and 434 are drawn between individual flash memory chips to ensure that an individual flash memory chip does not belong to more than one partition.

In the system of FIG. 4B, a partitioned flash memory data storage device 402 can offer exceptional performance, e.g., when used to store a corpus of data (e.g., a corpus of web pages) to be served in response to queries, and the individual partitions can alternate between serving the requests and being updated with new information. For instance, in a first time period the first, second, and third partitions 431, 432, and 433 can be used to provide the information to the host (e.g., information that may be requested in response to a user query), while the data on the fourth partition 434 is updated (e.g., in response to changes or additions to the web pages of the corpus). Then, in a second time period, the recently updated fourth partition 434, along with the second and third partitions 432 and 432 can be used to provide the information to the host, while the data on the first partition 431 is updated. Thus, data on each partition can be updated in round robin fashion, while query requests are served by the other partitions. This process can be repeated so that data is always served from partitions that act as read-only devices, and therefore provides very fast responses to read commands from the host without being slowed down by write commands, while the other partition is being updated with new information. Defining four partitions results in redundancy of information stored on the data storage device, so that if a partition, channel, or individual memory chip fails, such that one partition is no longer usable, the remaining three partitions can continue to be used to provide a data storage device in which each of the remaining partitions takes turns being updated while the other remaining partitions serve data requests.

As described above, the data storage device 402 can be connected to a host 450 though an interface 408, which can be a high speed interface, such as, for example a PCIe interface. The host can include, for example, a processor 452, a first memory 454, a second memory 456, and a partition engine 460. The first memory 454 can include, for example, a non-volatile memory device (e.g., a hard disk) adapted for storing machine-readable, executable code instructions that can be executed by the processor 452. The code instructions stored on the first memory 454 can be loaded into the second memory (e.g., a volatile memory, such as, a random access memory) 456 where they can be executed by the processor 452 to create the memory device detection engine 458 and the partition engine 460. The second memory can include logical blocks of "user space" devoted to user mode applications and logical blocks of "kernel space" 464 devoted to running the lower-level resources that user-level applications must control to perform their functions. The memory device detection engine 458 and the partition engine 460 can reside in the kernel space 464 of the second memory 456.

The configuration detection engine 458 can be configured to detect the number of flash memory chips 418 on the data storage device 402, and the partition engine 460 can be configured to define the first partition 421 and the second partition 422 of the data storage device. Thus, the configuration detection engine 458 and the partition engine 460, which run on the host 450, can be used by the host to discover hardware device properties of the data storage device 402 and then to define, via the host, the partitions 421 and 422. In one implementation, the configuration detection engine 458 can issue a query command to the data storage device, and in response to the query command the data storage device can return information to the host about, for example, the number of flash memory chips 418, the size (e.g., as measured in bytes) of each chip, the number of channels in the data storage device, the flash memory chips to which each the channel controller 412a-e is operably connected. Such information can be stored on the EEPROM 116 on the FPGA 410 and/or on the EEPROM 120a of the flash board of the data storage device 402. The configuration detection engine can poll the EEPROM 116 or the EEPROM 120a (e.g., during a boot-up operation of the host 450) to cause the data storage device to return such information to the host 450. In another implementation, the host may poll the flash memory chips 418 to provide the information about, for example, the number of flash memory chips 418, the size (e.g., as measured in bytes) of each chip, the number of channels in the data storage device, the flash memory chips to which each the channel controller 412a-e is operably connected.

The partition engine 460 can receive the information from the memory device detection engine 458 about the number of flash chips 418, the size of each flash chip, the number of channels and the memory chips to which each channels is operably connected, and, based on this information, the partition engine can define a first partition 421 and second partition 422 in the data storage device 402 The partition engine running on the host 450 can define the first partition to include memory blocks drawn from a first subset of the memory chips 418 and the second partition memory blocks drawn from a second subset of the memory chips 418, where the first subset does not include any individual flash chips of the second subset and the second subset does not include any individual flash chips of the first subset. The partition engine 460 then can map the physical memory block addresses (which may include, for example, a unique channel number, a unique flash memory chip number, and a block address within the flash memory chip) to logical addresses that can be used by application programs running the in the user space, such that the user space applications running on the host 450 can read data from the data storage device 402 and write data to the data storage device 402 with reference to the logical space addresses.

After a partition scheme of multiple partitions has been defined and data has been stored on the flash memory chips of the data storage device 100, the device can store information about the partitioning scheme, e.g., on the memory 116, so that the when the device is booted at a later time, it can communicate the partitioning scheme to the host 106 for the host to use. For example, the device may maintain information about the physical configuration of the data storage device, including a number of flash memory chips in the device and about the partitioning scheme, including which flash memory storage chips and channels are associated with which partitions on the memory 116. Then, when the system including the host 106 and the data storage device 100 is booted, the storage device 100 can communicate this information to the host 106, e.g., in response to a read operation performed by the configuration detection engine 458 of the host 106. The partitioning engine 460 of the host 106 then can define the partitions for the operating system and applications running on the host. For example, the partitioning engine 460 can define a first and second partition based on the information read from the storage device 100, where the first and second partitions do not include any of the same memory chips. The partitioning engine 460 also can allocate a logical to physical memory map for the first and second partitions, so that they user-level application programs can use logical addresses that then are mapped to physical memory addresses of the flash memory chips of the storage device 100.

The partition engine 460 also can be used to re-define the first partition of the data storage device to include a third subset of the plurality of flash memory chips, where the third subset is different from the first subset, and where the third subset does not include any flash memory chips of the second subset and wherein the second subset does not include any flash memory chips of the third subset. For example, with reference to FIG. 4A and FIG. 4B, a user may decide that the original partition scheme shown in FIG. 4A does not suit his or her needs, and therefore may use the host to redefine the partitions 421 and 422 (e.g., to include more or fewer flash memory chips in the particular partitions) or to add additional partitions to the scheme.

In one implementation, the first partition 421 can be redefined as partitions 431 and 433. Allowing the user to define the partitions through the host rather that forcing the user to accept a partition scheme that is pre-defined by, or pre-loaded in, the controller 410 gives the user flexibility to define partitions as he or she desires and to change the partition scheme when the need arises. In another implementation, the imminent failure of one of the flash memory chips, e.g., 418a, may be detected by the host, and in response to this information, the partition engine may re-define the first partition 421 to exclude the flash memory chip 418a from the partition, i.e., as the originally defined first partition but for the memory chip 418a. Thus, any number of partitions can be defined (up to the number of flash memory chips 118a and 118b in the storage device 100), and different partitions within a partition scheme can include different numbers of flash memory chips and can include different amounts of memory space.

The host also may include an address assignment engine 466 that can exist in the kernel 464 and that can assign physical memory addresses to data to be written to the data storage device 402. For example, an application running in user space 462 may call for data to be written from the host 450 to the data storage device 402, and the user space application may specify that the data be written to a particular logical memory address. The address assignment engine 466 may translate logical addresses into physical addresses that can include, for example, a particular channel that the data should be written to, a particular flash memory chip operably connected to the specified channel to which the data should be written, and a particular physical block address of the specified memory chip to which the data should be written. In such an implementation, the translation of logical addresses to physical memory space addresses can be performed by the address assignment engine 466, such that the role of the DRAM controller 254 of the FPGA 210 is reduced or irrelevant.

Figure 5:
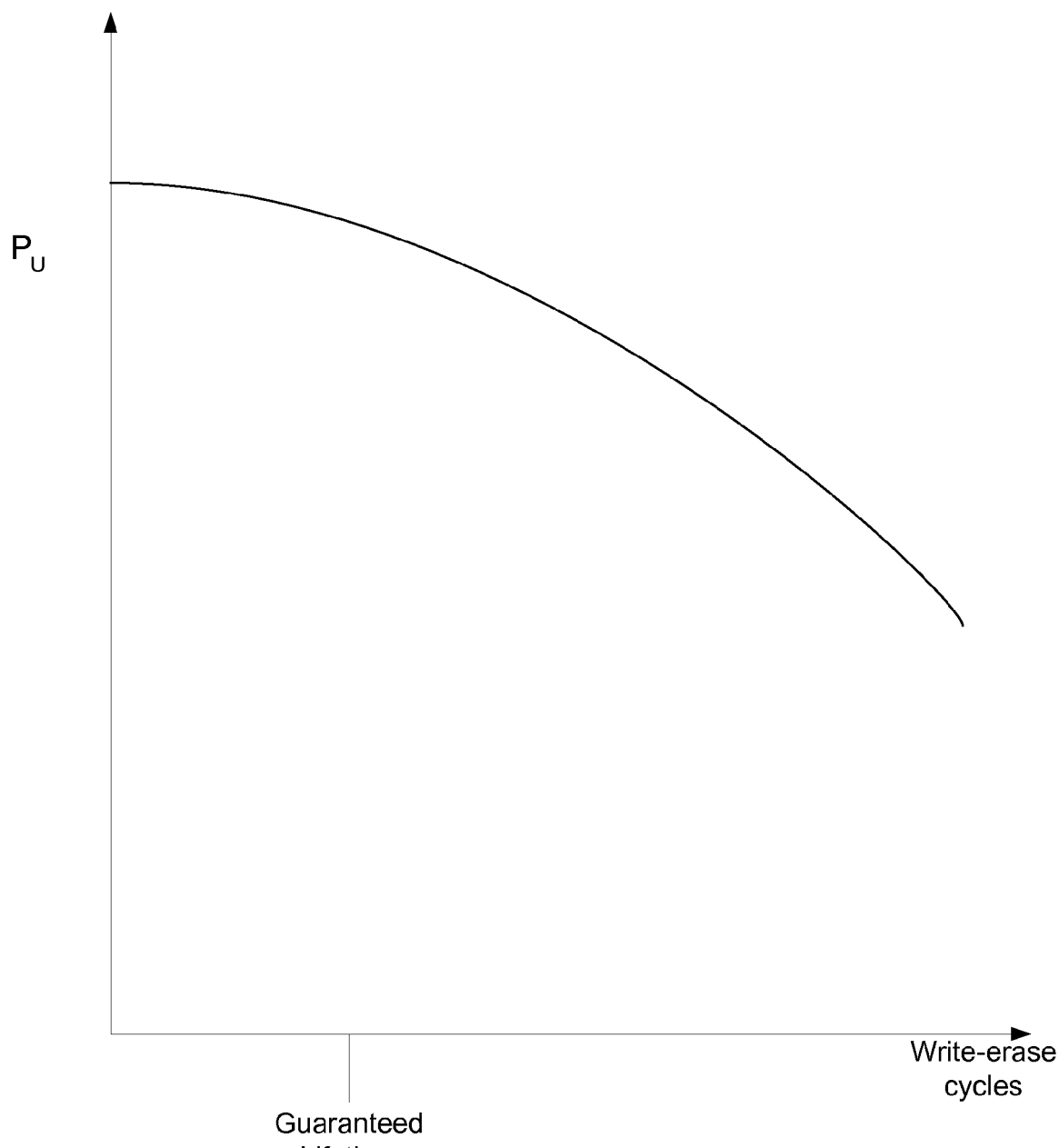
FIG. 5 is schematic graph of a probability that a memory block remains usable as a function of a number of write-erase operations performed on the block.

A limitation of flash memory chips 118, 218, 418 is that they can only experience a finite number of erase-write cycles before becoming inoperable (generally due to tunnel oxide degradation of the semiconductor material from which the chip is formed). For example, commercially available SLC chips can be guaranteed to withstand a specified number of write-erase cycles (e.g., around 100,000 to 1,000,000 write-erase cycles) before the wear begins to deteriorate the integrity of the storage, while MLC chips can be guaranteed to withstand a lower specified number of write-erase cycles (e.g., around 10,000 to 100,000). However, because the physical mechanism that causes a block or chip to wear out involves some uncertainty, the number of write-erase cycles a chip is specified to withstand before being inoperable is based on a statistical prediction of wear out rather than being a fixed number of cycles at which the each chip will actually wear out. Thus, some chips or blocks may become inoperable after fewer write-erase cycles than the specified number, while others may continue to operate long past the specified number of write-erase cycles. For example, FIG. 5 shows a schematic graph illustrating the probability, $P_U$, that a block or chip remains usable as a function of the number of write-erase cycles experienced by the block or chip. The probability, $P_U$, decays, for example, exponentially, and the guaranteed lifetime of the block or chip can be specified to occur at the number of write-erase cycles at which the probability reaches a specified value, e.g., $(1-1/e)$, 0.9, 0.95, or any other value that a manufacturer or standards body deems appropriate.

Thus, the data storage device 210, or a chip 218, or a block of a chip does not become physically inoperable when it reaches the number of write-erase cycles specified by the guaranteed lifetime. Indeed, a significant portion of the data storage device 210 remains operable even after the number of write-erase cycles reaches the number specified by the guaranteed lifetime. However, as the number of usable blocks decreases with use of the device 210, not only does the data storage capacity of the device decrease, but the speed of and writing to the device also can decrease. This latter phenomenon is due to decreased capacity of the device to perform garbage collection. That is, as the number of usable blocks of the device decreases, then for a given amount of data written to the device there is a smaller number of free blocks to which data can be copied during a garbage collection process. With a smaller number of free blocks relative to the number of blocks used to store data on the device it becomes more difficult to update the stored data, because during the garbage collection process there are fewer remaining usable blocks to which data can be copied.

Therefore, as discussed in more detail below, by monitoring the failure rate of chips 218 or blocks of chips a reliable device with good performance can be provided that continues to operate past the standard specified lifetime for typical devices. The monitored failure rate can be used to fit to a failure rate curve, such as the curve shown in FIG. 5, which shows an exemplary relationship between the probability, $P_U$, that a block or chip remains usable and the number of write-erase cycles experienced by the block or chip. The failure rate of blocks as a function of the number of write-erase cycles for the block can be monitored by a wear monitoring engine 366 on the host 350, and this data can be used to model the wear out curve for all blocks of a chip. The wear monitoring engine 366 can monitor when a block or chip experiences a write-erase cycle, and information about the total number of write-erase cycles for each block or chip can be stored in a memory (e.g., memory 352 or 354). Then, the data can be used, for example, by a modeling engine 365 running on host 350 and executed by the processor 352 to model the wear out characteristics of the chips or blocks of a device. Of course, when an error writing to a block is detected, the block is marked as a bad block, and it is removed from the usable area of the memory chip as far as the host 106 or controller 110 are concerned.

With the monitored data, predictions can be made about how many usable blocks of chips will remain after a certain number of write-erase cycles have been performed. For example, based on the monitored activity, it can be predicted that M usable blocks will remain after X write-erase cycles, but that N usable blocks will remain after Y write-erase cycles, where N is less than M and Y is greater than X. Using this information, the partitions 421, 422, 431, 432, 433, 434 can be resized from time to time to account for the decreasing number of useable blocks in the device 210. For example, if partition 421 starts its life with 500 Gb of usable space, then if modeling of the monitored data indicates that after 100,000 write-erase cycles that 98% of the blocks will remain operable but after 200,000 write-erase cycles that only 90% of the blocks will remain operable, then when 150,000 write-erase cycles have been performed the data on partition 421 can be saved to another location (e.g., partition 422), and partition 421 can be reformatted to present only 400 Gb of usable space to user mode applications on the host 106. When the device is not partitioned into multiple partitions but instead is presented to the user space applications as a single partition, then the single partition can be reformatted and resized. The reformatting and resizing of the partition can be performed automatically in response to the monitored activity, or, in another implementation, a warning or suggestion can be presented to a user to caution the user that the performance of the device 210 is expected to degrade in the near future and to offer the user the option of reformatting and resizing a partition of the device to maintain a certain performance of the device, albeit with a lower total storage capacity.

The decision of whether to reformat and resize a device or partition can also be based on the amount of valid data currently stored on the device. For example, a device with an original storage capacity of 500 Gb at the beginning of its life may degrade through use, such that only 90% of its blocks are operable. However, if the device is storing just 50 Gb of valid data, then the lowered amount of usable blocks is less of a concern than if the device were storing 420 Gb of valid data. Thus, in the former case of the device storing 50 Gb of valid data and having 90% of its block still operable, the device may not need to be reformatted and resized because a sufficient amount of free space will remain for performing garbage collection operations. However, in the latter case of the device storing 420 Gb of valid data and having 90% of its block still operable, the device may need to be reformatted and resized, to avoid a decrease in performance because of the difficulty of performing garbage collection for the 420 Gb of valid data with just 30 Gb (at most) remaining as free blocks to perform garbage collection.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., a FPGA or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A method of formatting a data storage device, wherein the device includes a plurality of flash memory chips, the method comprising:
    monitoring a failure rate of memory blocks of one or more flash memory chips of a storage device, wherein the storage device has a first usable size for user space applications;
    estimating a future usable size of the data storage device based on the monitored failure rate; and
    defining, via a host coupled to the data storage device, a second usable size of the data storage device for user space applications based on the monitored failure rate.

2. The method of claim 1, further comprising:
    writing valid data stored on the data storage device to a location off of the data storage device;
    reformatting the data storage device to have the second usable size; and
    writing at least a portion of the valid data to the reformatted data storage device from the location off the data storage device back to the data storage device.

3. The method of claim 1, wherein monitoring the failure rate of the memory blocks includes monitoring the failure rate of the memory blocks as a function of a number of write-erase cycles performed on the blocks.

4. The method of claim 1, wherein monitoring the failure rate of the memory blocks includes storing information about a number of successful write-erase operations performed on each of the memory blocks.

5. The method of claim 1, further comprising:
    monitoring an amount of valid data stored on the storage device,
    wherein defining, via the host coupled to the data storage device, the second usable size of the data storage device for user space applications is additionally based on the amount of valid data stored on the storage device.

6. The method of claim 1, wherein estimating the future usable size of the data storage device includes fitting data about the monitored failure rate of the memory blocks to a theoretical curve that characterizes a failure probability of a block.

7. The method of claim 1, wherein:
the storage device includes a first partition that includes a first subset of the plurality of flash memory chips and a second partition that includes a second subset of the plurality of flash memory chips, and
the first subset does not include any memory chips of the second subset and wherein the second subset does not include any memory chips of the first subset,
the method further comprising:
monitoring a failure rate of memory blocks of one or more flash memory chips of the first partition, wherein the first partition has a first usable size for user space applications;
estimating a future usable size of the first partition based on the monitored failure rate; and
defining, via the host coupled to the data storage device, a second usable size of the first partition for user space applications based on the monitored failure rate.

8. The method of claim 7, wherein a usable size of the second partition remains constant while the second usable size of the first partition is defined.

9. An apparatus comprising:
a flash memory data storage device that includes a plurality of flash memory chips; and
a host operably coupled to the data storage device via an interface, the host including:
a wear monitoring engine configured to monitor a failure rate of memory blocks of one or more of the flash memory chips;
a modeling engine configured to estimate a future usable size of the data storage device based on the monitored failure rate; and
a formatting engine configured to format the data storage device to have a first usable size for user space applications; and configured to format the data storage device to have a second usable size for user space applications based on the monitored failure rate.

10. The apparatus of claim 9, wherein the formatting engine is further configured to:
write valid data stored on the data storage device to a location off of the data storage device;
reformat the data storage device to have the second usable size; and
write at least a portion of the valid data to the reformatted data storage device from the location off of the data storage device back to the data storage device.

11. The apparatus of claim 9, wherein monitoring the failure rate of the memory blocks includes monitoring the failure rate of the memory blocks as a function of a number of write-erase cycles performed on the blocks.

12. The apparatus of claim 9, wherein the host further includes a memory configured to store information about a number of successful write-erase operations performed on each of the memory blocks.

13. The apparatus of claim 9, wherein the host further includes a configuration detection engine configured to monitor an amount of valid data stored on the storage device, and
wherein defining the second usable size of the data storage device for user space applications is additionally based on the amount of valid data stored on the storage device.

14. The apparatus of claim 13, wherein estimating the future usable size of the data storage device includes fitting data about the monitored failure rate of the memory blocks to a theoretical curve that characterizes a failure probability of a block.

15. The apparatus of claim 9, wherein the host further includes a partition engine configured to partition the data storage device into a first partition that includes a first subset of the plurality of flash memory chips and a second partition that includes a second subset of the plurality of flash memory chips, wherein the first subset does not include any memory chips of the second subset and wherein the second subset does not include any memory chips of the first subset, and
wherein the wear monitoring engine is further configured to monitor a failure rate of memory blocks of one or more flash memory chips of the first partition, wherein the first partition has a first usable size for user space applications,
wherein the modeling engine is further configured to estimate a future usable size of the first partition based on the monitored failure rate, and
wherein the formatting engine is further configured to define a second usable size of the first partition for user space applications based on the monitored failure rate.

16. The apparatus of claim 15, wherein a usable size of the second partition remains constant while the second usable size of the first partition is defined.

* * * * *